United States Patent
Sugimoto

(10) Patent No.: US 6,967,834 B2
(45) Date of Patent: Nov. 22, 2005

(54) ELECTRONIC APPARATUS

(75) Inventor: Ryotaro Sugimoto, Shizuoka-ken (JP)

(73) Assignee: Yamaha Corporation, Hamamatsu (JP)

( * ) Notice: Subject to any disclaimer, the term of this patent is extended or adjusted under 35 U.S.C. 154(b) by 59 days.

(21) Appl. No.: 10/392,696

(22) Filed: Mar. 20, 2003

(65) Prior Publication Data
US 2003/0179546 A1    Sep. 25, 2003

(30) Foreign Application Priority Data

Mar. 22, 2002 (JP) ............................. 2002-079921
Mar. 22, 2002 (JP) ............................. 2002-079922

(51) Int. Cl.$^7$ .............................................. G06F 1/16
(52) U.S. Cl. ..................... 361/686; 361/736; 361/748; 361/758; 361/784
(58) Field of Search ................ 361/679–680, 361/686, 736, 748, 683, 784, 752, 758

(56) References Cited

U.S. PATENT DOCUMENTS

| | | | |
|---|---|---|---|
| 4,311,990 A | * | 1/1982 | Burke ........................ 341/31 |
| 4,868,362 A | * | 9/1989 | Takeuji ..................... 219/757 |
| 5,150,282 A | * | 9/1992 | Tomura et al. ............. 361/818 |
| 6,172,620 B1 | * | 1/2001 | Brick et al. .................. 341/22 |

FOREIGN PATENT DOCUMENTS

JP    05-064077    3/1993

* cited by examiner

Primary Examiner—Yean-Hsi Chang
(74) Attorney, Agent, or Firm—Morrison & Foerster LLP

(57) ABSTRACT

There is provided an electronic apparatus which allows an operating panel surface thereof to be precisely finished and coated in a bright color and hence be attractive in appearance. A main case covers a plurality of operators so as to allow the operators to be operated. A first board, which processes signals generated by operations of the operators, is mounted in the main case and has electronic circuitry formed thereon. A second board, which processes signals at least from the first board, is mounted in the main case and has electronic circuitry formed thereon. The second board is disposed under the first board. At least one stay connects between the opposite sides of the main case. The first board is disposed on the stay, and the second board is disposed under the stay.

18 Claims, 3 Drawing Sheets

ELECTRONIC APPARATUS

BACKGROUND OF THE INVENTION

1. Field of the Invention

The present invention relates to an electronic apparatus having a main case covering a plurality of operators so as to allow these operators to be operated, a first board having formed thereon electric circuitry for processing signals generated by operations of the operators, and a second board having formed thereon electric circuitry for further processing signals generated at least by the first board.

2. Description of the Related Art

In conventional electronic apparatuses having a large number of operators in particular, it is desirable to dispose these operators on a large operating panel surface (housing surface). Therefore, in some electronic apparatuses of this type, a first board (operating circuit board) on which is formed electric circuitry for performing processing related to operators such as switches and a display is disposed under the operating panel surface, and further a second board (circuit board) on which is formed electric circuitry for performing further processing signals from the electric circuitry of the first board is disposed under the first board.

In the prior art, to assemble the first and second boards to a main case, the second board is mounted in a lower case, and the first board is mounted in an upper case (operating panel) such that it is attached to bosses suspended from the upper case using screws or the like. The bosses are welded to the upper case when the upper case is made of metal, or the bosses are formed integrally with the operating panel when the upper case is made of resin.

However, when the operating panel is made of metal, welding marks are noticeable even if the surface of the operating panel (operating panel surface) which is opposite the boss welded portions is coated with a paint. Therefore, the operating panel is often coated in a dark color (black) so as to make the marks as unnoticeable as possible. The color of the operating panel surface is thus limited and often monotonous. Further, when the operating panel is made of resin, shrinkage concavities (concave portions created by shrinkage of the resin during molding solidification) may be formed in the operating panel surface. The bosses are thus made as thin as possible. Alternatively, to reduce the volume of the bosses, the bosses which are formed integrally with the operating panel are comprised of two thin ribs to which the board is attached using screws. Consequently, in the former case, the bosses are not durable enough, whereas in the latter case, costs increase. Further, there are problems that, if the shrinkage concavities in the operating panel surface are neglected, the apparatus does not appear to have high quality and can be mistaken as a defective. Further, the operating panel surface constitutes a display section showing characters and the like. Accordingly, if the shrinkage concavities in the operating panel surface are neglected, the operating panel surface may not only lack readability but may also fail to be properly printed because of the shrinkage concavities.

Further, in the conventional electronic apparatuses having a large number of operators in particular, it is desirable to dispose these operators on a large operating panel surface (housing surface). Therefore, in some electronic apparatuses of this type, an operating circuit board on which operating elements such as switch devices are mounted is disposed under the operating panel surface. Further, the operating elements such as the switch devices mounted on the operating circuit board are operated using operators such as knobs, buttons, or dials.

However, it takes considerable time and labor to connect (attach) these operators to the operating elements (devices). Further, if the height of the operating elements such as the switches varies between a plurality of electronic apparatuses of the same type even with the same two-dimensional arrangement of the operating elements such as the switches with respect to the operating panel surface or if the height of the operating circuit board (the distance to the operating panel surface) varies between a plurality of electronic apparatuses of different types, then the use of common members such as a main case is effective for reducing costs.

SUMMARY OF THE INVENTION

It is a first object of the present invention to provide an electronic apparatus which allows an operating panel surface thereof to be precisely finished and coated in a bright color, and hence be attractive in appearance because the formation of shrinkage concavities is prevented even if the operating panel is made of resin.

It is a second object of the present invention to provide an electronic apparatus which allows operators to be easily attached to the electronic apparatus and which allows the sharing of as many component parts as possible between a plurality of electronic apparatuses of different types.

To attain the first object, in a first aspect of the present invention, there is provided an electronic apparatus comprising a plurality of operators, a main case that covers the plurality of operators so as to allow the operators to be operated, the main case having opposite sides, a first board mounted in the main case and having electronic circuitry formed thereon for processing signals generated by operations of the operators, a second board mounted in the main case and having electronic circuitry formed thereon for processing signals at least from the first board, the second board being disposed under the first board, and at least one stay that connects between the opposite sides of the main case, wherein the first board is disposed on the stay, and the second board is disposed under the stay.

With the above arrangement according to the first aspect of the present invention, since the first board is disposed on the stay, it is unnecessary to use bosses or the like used for mounting the first board, which are suspended from the upper case. Thus, the upper case, which is made of metal, does not include any welding marks. Further, even if the upper case is made of resin, no shrinkage concavities are formed on the operating panel surface. As a result, the operating panel surface can thus be carefully finished without damaging the operating panel surface. Moreover, the operating panel surface can be coated in a bright color. The operating panel surface can be thus made attractive in appearance even if the operating panel is made of resin. Furthermore, the first board can be reliably secured by providing a plurality of stays.

Preferably, the electronic apparatus according to the first aspect comprises an operator base mounted in the main case and disposed on the first board, the operator base having the plurality of operators provided thereon, the operator base having delimiting sections that delimit positions in which the operators are disposed.

With this arrangement, the operators can be disposed in the positions delimited by the delimiting sections. As a result, the operators can be easily attached to the electronic apparatus.

Preferably, in the electronic apparatus according to the first aspect, the first board is connected to the second board via the at least one stay.

With this arrangement, wiring between the first board and the second board in the main case can be easily carried out.

Preferably, the electronic apparatus according to the first aspect comprises a fastening device, and the main case has a first connecting part for connection to the stay, the stay has a second connecting part for connection to the main case, and the first board has a third connecting part that is connected to the main case together with the first and second connecting parts, the first to third connecting parts being fastened together by the fastening device.

With this arrangement, the number of parts and assembling steps required can be reduced.

Preferably, in the electronic apparatus according to the first aspect, the operator base has a fourth connecting part for connection to the main case, the fourth connection part being fastened together with the first to third connecting parts by the fastening device.

With this arrangement, the number of parts and assembling steps required can be further reduced.

To attain the first object, in a second aspect of the present invention, there is provided an electronic apparatus comprising a plurality of operators, a main case that covers peripheries of the plurality of operators so as to allow the operators to be operated, the main case having opposite sides, a first board mounted in the main case and having electronic circuitry formed thereon for processing signals generated by operations of the operators, a second board mounted in the main case and having electronic circuitry formed thereon for processing signals at least from the first board, the second board being disposed under the first board, at least one stay that connects between the opposite sides of the main case, and a third board mounted in the main case and disposed on the stay at a predetermined location thereof in a longitudinal direction thereof, wherein the first board is disposed on the stay, and the second board is disposed under the stay.

With the above arrangement according to the second aspect of the present invention, it is unnecessary to use bosses or the like used for mounting the first board, which are suspended from the upper case of the main case. Therefore, the operating panel surface of the main case can be carefully finished without damaging the operating panel surface. Moreover, the operating panel surface can be coated in a bright color, and hence can be made attractive in appearance.

Further, since at least one stay is connected between the opposite sides of the main case, it is possible to reliably secure the third board, which carries external terminal connectors and hence must be firmly secured to the main case, to the stay at a predetermined location thereof in a longitudinal direction thereof. Further, the third board can be additionally mounted in the main case later, whereby the number of boards mounted in the main case can be increased. This means that a fourth board, a fifth board, and so on can be mounted in the main case.

To attain the second object, in a third aspect of the present invention, there is provided an electronic apparatus comprising an operating panel having a panel surface, a plurality of operating elements disposed below the panel surface, an operating circuit board having operating circuitry formed thereon for processing signals generated by operations of the operating elements, the operating circuit board having the operating elements provided thereon, the operating circuit board being disposed below the panel surface, a plurality of operators disposed under the panel surface and connected to the operating elements, and an operator base having the operators provided thereon, the operator base being disposed under the panel surface, for delimiting positions in which said operators are disposed in mounting the operators into the electronic apparatus, wherein the operating circuit board is disposed under the panel surface via the operator base having a predetermined thickness that defines a distance from the panel surface.

With the above arrangement according to the third aspect of the present invention, the operators are disposed in the positions delimited by the operator base. As a result, the operators can be easily attached to the electronic apparatus. Since the operator base is disposed between the operating circuit board and the operating panel, the main case or the like can be shared between a plurality of electronic apparatuses of different types by changing the thickness of the operator base.

Moreover, it is unnecessary to use bosses or the like used for mounting the operating circuit board, which are suspended from the operating panel. Therefore, the operating panel surface can be carefully finished without damaging the panel surface. Moreover, the panel surface can be coated in a bright color, and hence can be made attractive in appearance.

Preferably, the electronic apparatus according to the third aspect comprises a fastening device, and the operator base has a first connecting part for connection to the panel surface, and the operating circuit board has a second connecting part for connection to the operator base, the first and second connecting parts being fastened together by the fastening device.

With this arrangement, the number of parts and assembling steps required can be reduced.

To attain the second object, in a fourth aspect of the present invention, there is provided an electronic apparatus comprising an operating panel having a panel surface, a plurality of operating elements disposed below the panel surface, an operating circuit board having operating circuitry formed thereon for processing signals generated by operations of the operating elements, the operating circuit board having the operating elements provided thereon, the operating circuit board being disposed below the panel surface, a plurality of operators disposed under the panel surface and connected to the operating elements, an operator base having the operators provided thereon, the operator base being disposed under the panel surface, for delimiting positions in which said operators are disposed in mounting the operators into the electronic apparatus, and at least one stay to which the operating circuit board is attached, wherein the operator base is disposed between the panel surface and the stay.

With the above arrangement according to the fourth aspect of the present invention, the operators are disposed in the positions delimited by the operator base. As a result, the operators can be easily attached to the electronic apparatus. Since the operator base is disposed between the at least one stay to which the circuit board is attached and the operating panel, the main case or the like can be shared between a plurality of electronic apparatuses of different types by setting the height of the stay according to the thickness of the operator base and the distance from the operating circuit board to the panel surface, if the operator base is disposed in contact with or adjacent to the operating panel.

Moreover, it is unnecessary to use bosses or the like used for mounting the operating circuit board, which are suspended from the operating panel. Therefore, the operating panel surface can be carefully finished without damaging the panel surface. Moreover, the panel surface can be coated in a bright color and hence can be made attractive in appearance.

Preferably, the electronic apparatus according to the fourth aspect further comprises at least one second board, and the operating circuit board is connected to the second board via the at least one stay.

With this arrangement, wiring connecting between the operating circuit board and the second board in the main case can be easily carried out.

To attain the first object, in a fifth aspect of the present invention, there is provided an electronic apparatus comprising a plurality of operators, a first board and having electronic circuitry formed thereon for processing signals generated by operations of the operators, a second board and having electronic circuitry formed thereon for processing signals at least from the first board, at least one stay that extends in one direction along planes in which the first board and the second board are disposed, the first board being mounted on the stay and the second board being mounted under the stay, an upper case that covers the plurality of operators, a fixing device that fixes the stay to the upper case via the first board, and a lower case that is disposed under the upper case to form a main case together with the upper case, wherein the plurality of operators, the first board, the second board, and the stay fixed to the upper case via the first board by the fixing device are mounted in the main case between the upper case and the lower case.

With the above arrangement according to the fifth aspect of the present invention, since the first board is disposed on the at least one stay, it is unnecessary to use bosses or the like used for mounting the first board, which are suspended from the upper case. Thus, the upper case, which is made of metal, does not include any welding marks. Further, even if the upper case is made of resin, no shrinkage concavities are formed on the operating panel surface. As a result, the operating panel surface can thus be carefully finished without damaging the operating panel surface. Moreover, the operating panel surface can be coated in a bright color and hence can be made attractive in appearance even if the operating panel is made of resin. Furthermore, the first board can be reliably secured to the upper case.

To attain the first object, in a sixth aspect of the present invention, there is provided an electronic apparatus being capable of connecting to an external apparatus, comprising a plurality of operators, a first board having electronic circuitry formed thereon for processing signals generated by operations of the operators, a second board having electronic circuitry formed thereon for processing signals at least from the first board, a third board having electronic circuitry formed thereon for carrying out communication with the external apparatus, an upper case that covers the plurality of operators, a lower case that is disposed under the upper case to form a main case together with the upper case, and at least one stay that extends in one direction along planes in which the first board and the second board are disposed, the stay having downwardly extending legs at opposite ends thereof, the legs being mounted on the lower case, wherein the plurality of operators, the first board, the second board, the third board, and the stay are mounted in the main case between the upper case and the lower case, and the first board, the second board, the third board are mounted on the stay.

With the above arrangement according to the sixth aspect of the present invention, since the first board is disposed on the at least one stay, it is unnecessary to use bosses or the like used for mounting the first board, which are suspended from the upper case. Thus, the upper case, which is made of metal, does not include any welding marks. Further, even if the upper case is made of resin, no shrinkage concavities are formed on the operating panel surface. As a result, the operating panel can thus be carefully finished without damaging the operating panel surface. Moreover, the operating panel surface can be coated in a bright color and hence can be made attractive in appearance even if the operating panel is made of resin. Furthermore, the first board, the second board, and the third board can be reliably secured to the lower case.

Preferably, in the electronic apparatuses according to the first and fifth aspects, the stay has a wiring accommodating section that accommodates wiring connecting between the first board and the second board.

With this arrangement, wiring between the first board and the second board in the main case can be easily carried out.

Preferably, in the electronic apparatuses according to the second and sixth aspects, the stay has a wiring accommodating section that accommodates wiring connecting between the first board and the second board and wiring connecting between the second and the third board.

With this arrangement, wiring between the first board and the second board and wiring between the second and the third board in the case can be easily carried out.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described with reference to the drawings showing preferred embodiments thereof.

Figure 1:
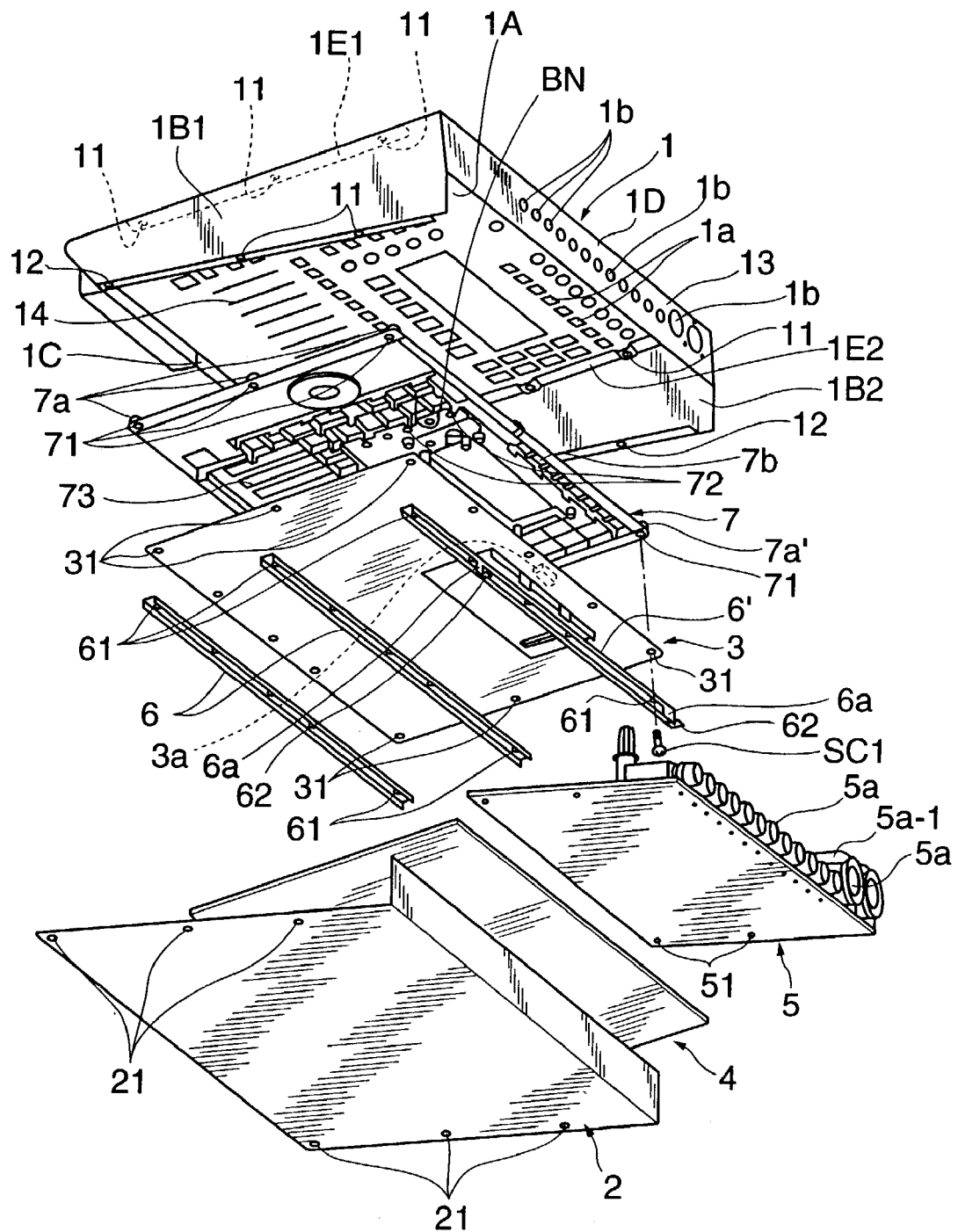
FIG. 1 is an exploded perspective view of essential parts of an electronic apparatus according to a first embodiment of the present invention.

FIG. 1 is an exploded perspective view of essential parts of an electronic apparatus according to a first embodiment of the present invention. In the figure, the electronic apparatus is illustrated as viewed from below off to the right. In the present embodiment, the electronic apparatus is applied to, for example, a mixer.

In FIG. 1, the present electronic apparatus has a main case which is comprised of an upper case 1 and a lower case 2. A first board 3 as an operating circuit board, a second board 4 and a third board 5 as circuit boards, three stays 6, 6, 6', and an operator base 7 are accommodated inside the main case. Operating elements 3a such as switch devices are disposed on the first board 3. The first board 3 has electric circuitry formed thereon for performing processing related to the operating elements 3a, the second board 4 has electric circuitry formed thereon for mixing and amplifying signals corresponding to the respective operating elements 3a from the electric circuitry on the first board 3, and the third board 5 has external terminal connectors provided thereon.

The upper case 1 and the lower case 2 are each formed from a plate by press-working or the like. The upper case 1 is comprised of a top panel 1A as an operating panel, side panels 1B1 and 1B2, a front panel 1C, and a rear panel 1D. The top panel 1A, the front panel 1C, and the rear panel 1D are formed in one body having a U-shaped cross section. A plurality of operator holes 1a are formed in the top panel 1A of the upper case 1, in which a plurality of operators are mounted. A plurality of connector holes 1b are formed in the rear panel 1D, in which external terminal connectors are mounted.

Figure 3:
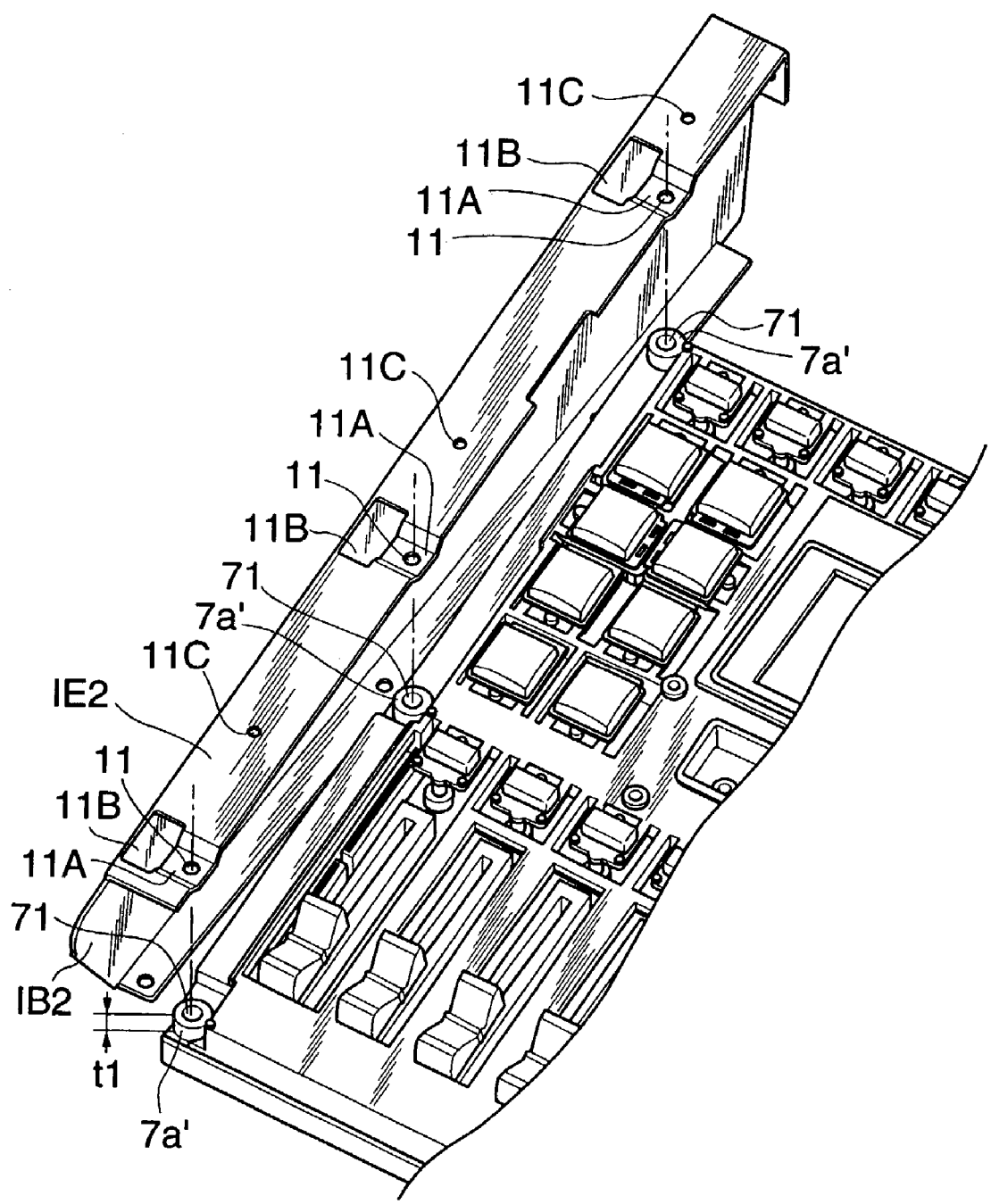
FIG. 3 is a perspective view of a side panel of the electronic apparatus according to the first embodiment.

Flanges 1E1 and 1E2, which are folded at right angles, are formed integrally with the side panels 1B1 and 1B2 at opposite upper side edges thereof facing respective opposite side edges of the top panel 1A. Threaded holes 11 for tightening screws (hereinafter referred to as "tightening threaded holes") are formed in each of the flanges 1E1 and 1E2. As shown in FIG. 3, each of the tightening threaded holes 11 is formed in a slightly projected mount 11A formed by extrusion. The mounts 11A may be formed with desired heights of 2 mm to 10 mm by making a cut in a direction perpendicular to the extruding direction or by forming through holes 11B in the flanges 1E1 and 1E2 when pressing the side panel. The height of the pedestal may be zero. Tightening through holes 31 are formed in opposite side edges of the first board 3 at locations corresponding to the tightening threaded holes 11 in the upper case 1. Bosses 7a and 7a', each having a predetermined thickness t1 (vertical size), are formed on opposite side edges of the operator base 7 at locations corresponding to the tightening threaded holes 11 in the upper case 1. Tightening through holes 71 corresponding, respectively, to the tightening threaded holes 11 are formed in the bosses 7a and 7a'. Furthermore, tightening through holes 61 are formed in opposite ends of each of the three stays 6, 6, and 6' at locations corresponding to the tightening threaded holes 11 in the upper case 1.

Downwardly pending board attaching portions 6a are formed on the stay 6' which is closest to the rear panel 1D. Threaded holes 62 are formed in the respective board attaching portions 6a and are used to attach the third board 5 to the stay 6'. Threaded holes 51 are formed in opposite side edges of the third board 5 at locations corresponding to the threaded holes 62 in the board attaching portions 6a of the stay 6'.

Threaded holes 12 are formed in opposite lower side edges of the side plates 1B1 and 1B2 to join the upper case 1 and the lower case 2 together by screws. Through holes 21 are formed in opposite side edges of the lower case 2 at locations corresponding to the threaded holes 12 in the upper case 1.

To assemble the main case constructed as above, the operator base 7 is placed into the upper case 1. The first board 3 is placed onto a back surface of the operator base 7. The three stays 6, 6, and 6' are placed onto a back surface of the first board 3. Screws SC1 (six screws are used, but only one of them is shown) are passed through the respective tightening through holes 61 in the stays 6, 6, and 6', the respective tightening through holes 31 in the first board 3, and the respective tightening through holes 71 in the operator base 7. The screws SC1 are then tightened into the tightening threaded holes 11 in the upper case 1. This screwing is thus carried out at six locations, that is, in the six tightening through holes 61 in the respective opposite ends of the three stays 6, 6, and 6'. In this way, the operator base 7, the first board 3, and the three stays 6, 6, and 6' are fastened together with the side plates 1B1 and 1B2 constituting the upper case 1.

Then, the third board 5 is placed onto the stay 6' closest to the rear panel 1D. Screws, not shown, are passed through the through holes 51 in the third board 5 and are then tightened into the respective threaded holes 62 in the board attaching portions 6a of the stay 6'. Further, at the same time, connectors 5a, which are disposed on the third board 5, are fitted into the respective corresponding connector holes 1b in the rear panel 1D of the upper case 1. Then, screws, not shown, are passed through holes 13 formed in the rear panel 1D around the respective connector holes 1b and are then tightened into respective threaded holes 5a-1 formed in the connectors 5a. Thus, the third board 5 is reliably secured to the stay 6' and the rear panel 1D of the upper case 1.

In the above described manner, the operator base 7, the first board 3, the three stays 6, 6, and 6', and the third board 5 are mounted in the upper case 1. The second board 4 is mounted into the lower case 2 using screws or the like, not shown. Then, screws, not shown, are passed through the through holes 21 in the lower case 2 and are then tightened into the respective threaded holes 12 in the side panels 1B1 and 1B2 of the upper case 1. The upper case 1 and the lower case 2 are thus assembled together.

The operator base 7 is formed of an elastic member. A plurality of operators 7b (buttons and the like) are provided on the operator base 7 at predetermined locations.

The operators 7b are connected to the main body (frame) of the operator base using hinges or the like. Further, the operator base 7 is formed thereon with delimiting sections (through holes formed through the operator base 7 and open to the upper case 1) 72 that delimit positions in which the operators 7b are to be disposed (that is, the position in which the operator base 7 itself is to be disposed) and a button BN (vertically movable member). Operators (knobs or the like) of operating elements (parts constituting switch contacts or the like) secured to the first board 3 are engaged with the respective corresponding delimiting sections (through holes) 72. An actuator for an operating element is engaged with the button portion BN. Thus, the positions of the operators 7b are delimited, and the operators 7b can be fitted into the respective corresponding operator holes 1a formed in the top panel 1A of the upper case 1. The first board 3 also has operating elements including slide volumes. Operators (knobs) of the slide volumes extend from the operating panel surface of the upper case 1 through slots 14 in the upper case 1 and slots 73 in the operator base 7 and are connected to slide volume sliders. Such operating elements and operators also include a rotary encoder and other types.

The electric circuitry formed on the first board 3 performs signal processing according to operations by the operators. The first board 3 is connected to the second board 4 via cables, not shown, so that the electric circuitry formed on the second board 4 performs various processes on signals obtained from the electric circuitry on the first board 3. The connectors 5a provided on the third board 5 is used as external terminal connectors for inputs from and outputs to external devices. The third board 5 is also connected to the second board 4 via cables, not shown.

To produce an upper case unit, i.e. the upper case 1 including the top panel 1A, side panels 1B1 and 1B2, front panel 1C, rear panel 1D, first board 3, stays 6, 6, and 6', and operator base 7, the screws SC1 are passed through the tightening through holes 61 in the stays 6, 6, and 6', the tightening through holes 31 in the first board 3, and the tightening through holes 71 in the operator base 7. The screws SC1 are then tightened into the tightening threaded holes 11 in the flanges 1E1 and 1E2, to thus produce a provisionary unit before completion of the upper case unit.

The front panel 1C and the rear panel 1D are attached to the provisionary unit. And then, screws, not shown, are passed through the tightening threaded holes 11 in the flanges 1E1 and 1E2 and are tightened into tightening threaded holes, not shown, in the top panel 1A, thus completing the upper case unit. Therefore, the upper case unit is completed by attaching the top panel 1A to the provisionary unit.

In the upper case unit, the operators having various heights can be disposed on the operator base 7 by changing the heights of the mounts 11A formed on the flanges 1E1 and 1E2 without changing the thickness of the operator base 7.

As described above, the electronic apparatus according to the present embodiment is comprised of the main case (1, 2) in which a plurality of operators 7b are arranged on the upper side surface of the top panel 1A as the operating panel surface of the electronic apparatus, the first board 3 mounted in the main case (1, 2) for performing signal processing according to operations by the operator 7b, and the second board 4 mounted in the main case (1, 2) for processing signals at least from the first board 3, with the second board 4 being disposed under the first board 3. Further, the stays 6, 6, and 6' are provided to connect between the side panels 1B1 and 1B2 at the opposite sides of the main case (1, 2), with the first board 3 being disposed on the stays 6, 6, and 6', and the second board 4 being disposed under the stays 6, 6, and 6'.

Since the first board 3 is disposed on the stays 6, 6, and 6', it is unnecessary to use bosses or the like used for mounting the first board 3, which are suspended from the upper case 1. Thus, the upper case 1, which is made of metal, does not include any welding marks. Further, even if the upper case 1 is made of resin, no shrinkage concavities are formed on the operating panel surface (the upper side surface of the top panel 1A). Therefore, the operating panel surface can be precisely finished and coated in a bright color. The operating panel surface can be thus made attractive in appearance even if it is made of resin.

Further, the electronic apparatus according to the present embodiment, in which the upper side surface of the top panel 1A is used as an operating panel surface, and the operating elements 7b are arranged under the top panel 11A, includes the first board 3 (operating circuit board) for signal processing according to operations of the operating elements 7b, disposed under the top panel 1A, and the operator base 7 that determines the positions of the operators 7b which are connected to the respective corresponding operating elements 3a when the operators 7b are placed, and the first board 3 is mounted via the operator 7 which has an arbitrary thickness that determines the distance of the first board 3 from the top panel 1A.

Further, the operator base 7 has provided thereon a large number of operators 7b corresponding to the respective operating elements 3a, and serves to determine the positions of the operators 7b. Therefore, merely by placing the operator base 7 inside the electronic apparatus, the operators can be easily mounted in the electronic apparatus. Thus, the attachment of the operators 7b to the electronic apparatus is facilitated. Further, the operator base 7 has the bosses 7a and 7a' that are interposed between the top panel 1A and the first board 3 in contact with them. Therefore, a plurality of electronic apparatuses of the same type or different types can be easily configured by providing a plurality of types of operator bases having different bosses 7a and 7a' of respective different values of thickness (heights) and fastening an arbitrary one of the operator bases together with the upper case 1 (operating panel section) as well as with the first board 3. Alternatively, a plurality of electronic apparatuses of the same type or different types can be easily configured by providing a common operator base and a plurality of types of upper cases 1 having different mounts of respective different heights for the tightening threaded holes 11 and fastening the operator base together with an arbitrary one of the upper cases 1 as well as with the first board 3, or by carrying out both of these methods. Further, by disposing the operator base 7 between the first board 3 and the top panel 1A, the main case (1, 2) or the like can be shared between a plurality of electronic apparatuses of different types including different operating elements such as switch devices which have respective different heights or different first boards of respective different heights. Alternatively, a different types of electronic apparatus can be configured by interposing a selected one of spacers of respective different values of thickness between the bosses 7a and 7a' of the operator base 7 and the tightening threaded holes 11 in the upper case 1.

Further, by virtue of the stay 6', that connects between the opposite side panels 1B1 and 1B2 of the main case (1, 2), it is possible to reliably secure the third board 5, which carries external terminal connectors and hence must be firmly secured to the main case, to the stay 6' at desired longitudinal positions thereof.

Figure 2:
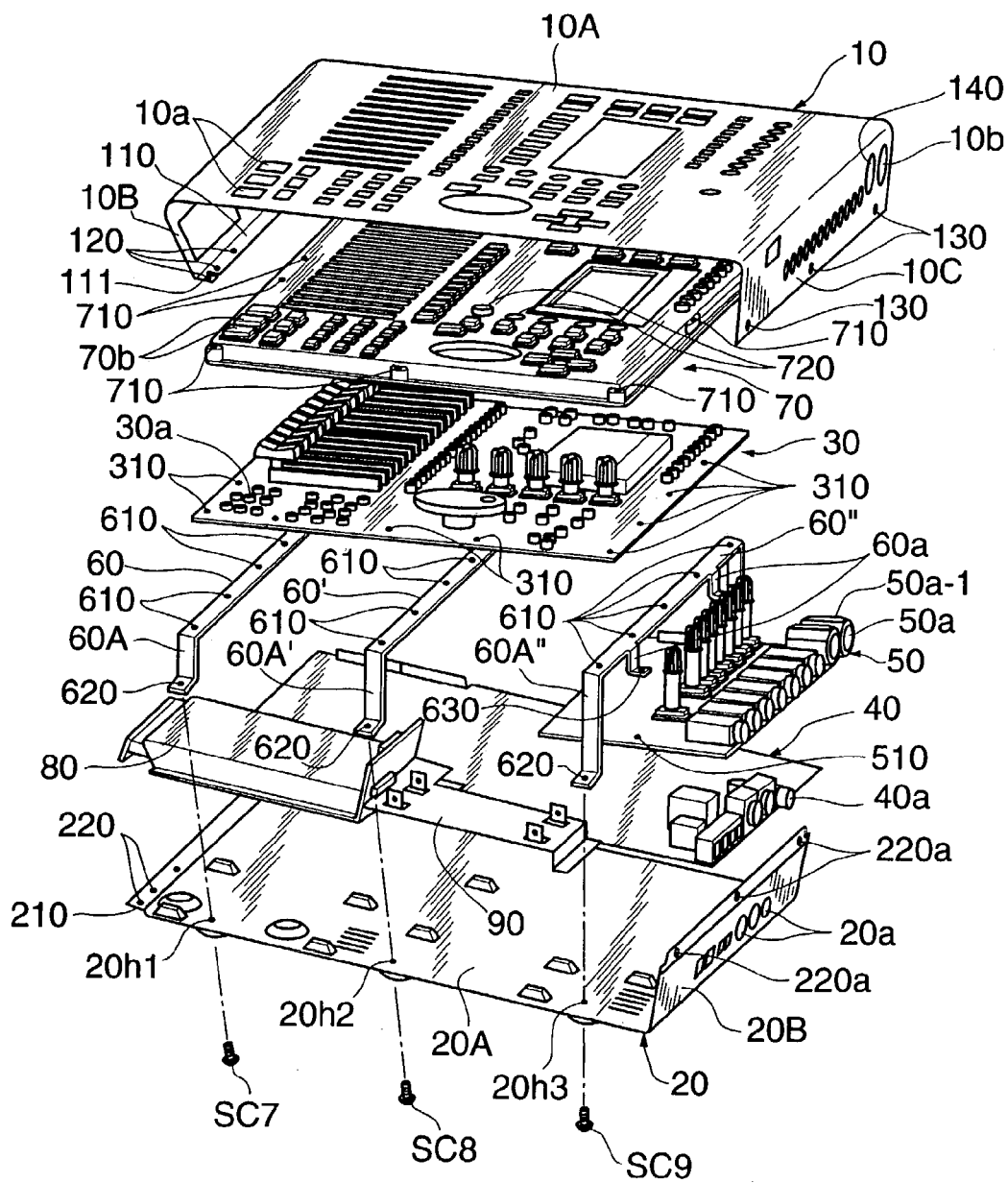
FIG. 2 is an exploded perspective view of essential parts of an electronic apparatus according to a second embodiment of the present invention.

FIG. 2 is an exploded perspective view of essential parts of an electronic apparatus according to a second embodiment of the present invention. In FIG. 2, the electronic apparatus is illustrated as viewed from above off to the right. The electronic apparatus according to the present embodiment is applied to, for example, a mixer.

In FIG. 2, the present electronic apparatus has a main case which is comprised of an upper case 10 and a lower case 20. A first board 30, a second board 40, a third board 50, three stays 60, 60', and 60", and an operator base 70 are accommodated in the main case. The first board 30, second board 40, and third board 50 correspond in function to the first board 3, second board 4, and third board 5, respectively. Though not shown, side plates made of resin or the like are fitted on respective opposite sides of the upper case 10 and the lower case 20 after assemblage thereof. Operating elements 30a such as switch devices are disposed on the first board 30.

The upper case 10 and the lower case 20 are formed from metal plates by press-working. The upper case 10 is comprised of a top panel 10A, a front panel 10B, and a rear panel 10C. A plurality of operator holes 10a are formed in the top panel 10A of the upper case 10 so that a plurality of operators can be arranged in these holes. A plurality of connector holes 10 are formed in the rear panel 10c so that external terminal connectors can be disposed in these holes. Further, the lower case 20 is comprised of a bottom panel 20A and a rear panel 20B. A plurality of connector holes 20a are formed in the rear panel 20B of the lower case 20 so that external terminal connectors can be disposed in these holes.

Tightening threaded holes 610 are formed in each of the three stays 60, 60' and 60". The stays 60, 60' and 60" have legs 60A, 60A' and 60A", respectively. Threaded holes 620, 620, and 620 are formed in opposite lower ends of the legs 60A, 60A', and 60A", respectively. The respective legs 60A, 60A' and 60A" of the three stays 60, 60', and 60" have different heights such that the leg 60A of the stay 60 is the lowest, the leg 60A of the stay 60' is higher than the leg 60A of the stay 60, and the leg 60A" of the stay 60" is the highest. This difference in height is for the first board 30 and the operator base 70 to be mounted in the upper case 10 so as to correspond to the inclination of the top panel 10A of the upper case 10.

Tightening through holes 310 are formed in opposite side edges of the first board 30 at locations corresponding to the respective tightening threaded holes 610 in the stays 60, 60' and 60". Tightening through holes 710 are formed opposite side edges of the operator base 70 at locations corresponding to the respective tightening threaded holes 610 in the stays 60, 60' and 60".

Downwardly pending board attaching portions 60a are formed on the stay 60" which is closest to the rear panel 10C. Threaded holes 630 are formed in the board attaching portions 60a to attach the third board 50 to the stay 60". Threaded holes 510 are formed in opposite ends of the third board 50 at locations corresponding to the respective threaded holes 630 in the board attaching portions 60a.

An inwardly bent securing guide 110 having opposite ends 111 is formed on a lower side edge of the front panel 10B of the upper case 10. Threaded holes 120 are formed in the securing guide 110 to attach the lower case 20 to the front panel 10B by screws. Further, through holes 130 are formed in a lower side edge of the rear panel 10C of the upper case 10 to attach the upper case 20 to the rear panel 10C by screws. On the other hand, an attaching flange 210 is formed on a side edge of the lower case 20, having through holes 220 formed therein at locations corresponding to the respective threaded holes 120 in the upper case 10. The attaching flange 210 and the securing guide 110 are fastened together by screws, not shown, by passing the screws through the through holes 120 and 220 from below such that the attaching flange 210 is placed upon the securing guide 110. At this time, one of the above-mentioned side plates made of resin, not shown, is interposed at a lower edge thereof between the attaching flange 210 and the securing guide 110, to thereby secure the three elements, i.e., the attaching flange 210, the securing guide 110, and the side plate at the ends 111. Threaded holes 220a are formed in an upper edge of the rear panel 20B of the lower case 20 at locations corresponding to the respective through holes 130 in the rear panel 10C of the upper case 10.

To assemble the main case constructed as above, the second board 40 is placed inside the lower case 20 and fastened thereto by screws, not shown. At this time, connectors 40a disposed on the second board 40 are fitted into the corresponding connector holes 20a in the rear panel 20B of the lower case 20. Further, a CD-RW case 80 and an HDD attaching table 90 are attached to the lower case 20 together with the second board 40. Then, screws SC7, SC8, and SC9 are inserted into the respective threaded holes 620, 620, and 620, via respective threaded holes 20h1, 20h2, and 20h3 formed in opposite end edges of the lower case 20, to attach the three stays 60, 60', and 60" to the lower case 20. Furthermore, the third board 50 is placed on the board attaching portions 60a of the stay 60". Screws, not shown, are passed through the threaded holes 510 in the third board 50 and are inserted into the respective corresponding threaded holes 630 in the board attaching portions 60a to attach the third board 50 to the stay 60".

Then, the first board 30 is placed onto the three stays 60, 60', and 60", and the operator base 70 is placed onto the first board 30. Then, screws, not shown, are passed through the tightening through holes 710 in the operator base 70 and the tightening through holes 310 in the first board 30 and are inserted into the tightening threaded holes 610 in the stays 60, 60', and 60" to fasten the operator base 70 and the first board 30 together to the three stays 60, 60', and 60" on the lower case 20.

Then, the securing guide 110 formed on the lower side of the front panel 10B of the upper case 10 is placed onto the side edge of the lower case 20. Screws, not shown, are then passed through the through holes 220 in the attaching flange 210 from below the lower case 20 and inserted into the threaded holes 120 in the securing guide 110 to attach the lower case 20 to the front panel 10B. Further, the lower side edge of the rear panel 10C of the upper case 10 is placed on the upper edge of the rear panel 20B of the lower case 20. Screws, not shown, are passed through the through holes 130 in the rear panel 10C and are then inserted into the threaded holes 220a in the rear panel 20B to attach the upper case 10 to the lower case 20. Thus, the upper case 10 and the lower case 10 are assembled. At this time, connectors 50a disposed on the third board 50 are fitted into respective corresponding connector holes 10b in the rear panel 10C of the upper case 10. Then, screws, not shown, are passed through holes 140 formed in the rear panel 10C around the respective connector holes 10b and are then inserted into threaded holes 50a-1 formed in the respective connectors 50a to reliably secure the third board 50 to the stay 60" and the rear panel 10C of the upper case 10.

The operator base 70 is formed of an elastic member like the operator base 7 of the first embodiment. A plurality of operators 70b (buttons or the like) are provided on the operator base 70 at predetermined locations. Further, the operator base 70 is formed thereon with delimiting sections (through holes formed through the operator base 70 and open to the upper case 10) 720 that delimit positions in which the operators 70b are to be disposed. The delimiting sections 720 are engaged with projections or the like formed as operators (knobs or the like) for operating elements (parts constituting switch contacts or the like) secured to the first board 30. Thus, the positions of the operators 70b are delimited. Consequently, when the operator base 70 is mounted in the upper case 10, the operators 70b are surely fitted into the respective corresponding operator holes 10a formed in the top panel 10A of the upper case 10. In FIG. 2, operators (knobs) or the like for slide volumes are attached to respective corresponding slide volume sliders on the first board 30.

Further, the basic functions of the first board 30, the second board 40, and the third board 50 are similar to those in the first embodiment. The first board 30 is connected to the second board 40 via cables, not shown. The third board 50 is connected to the second board 40 via cables, not shown.

As described above, also in the second embodiment, the electronic apparatus has the main case (10, 20) with a plurality of operators 10b arranged on the upper side surface of the top panel 10A as the operating panel surface of the electronic apparatus. In the main case (10, 20), the second board 40 is disposed under the first board 30, the first board 30 is disposed on the stays 60, 60', and 60", which connect between the opposite sides of the main case (10, 20), and the second board 40 is disposed under the stays 60, 60', and 60". That is, since the first board 30 is disposed upon the stays 60, 60', and 60", bosses or the like are not required to attach the first board 30, resulting in no welding marks being present on the upper case 10. Even if the panel is made of resin, no shrinkage concavities are formed on the operating panel surface. Therefore, the operating panel surface can be precisely finished and coated in a bright color. The operating panel surface can be thus made attractive in appearance even if it is made of resin.

In the above-described second embodiment, the legs 60A, 60A', and 60A" of the stays 60, 60', and 60" have functions as spacers for setting the gap between the first board 30 and the top panel 10A of the upper case 10. Alternatively, such spacers may be provided on the lower case 10. For example, during press-working of the lower case, part of the bottom wall may be cut out to form raised portions, and, for example, stays similar to those in the first embodiment may be disposed on the top of the raised portions. In this case, holes formed by cutting in the bottom wall of the lower case may be covered with blind patches made of plastics or the like. Then, when the blind patches are removed, the holes may be used as areas for visually checking a CD-RW mounted in the case 80. Further, bosses or the like may be provided on the lower case to be used as spacers.

The above-described embodiments provide the effects described below.

Bosses or the like are not required to mount the first board (3, 30) inside the upper case (1, 10). Consequently, the operator base (7, 70) can be easily arranged between the upper case and the first board, and the operator base then serves to facilitate attachment of the operators (7b, 70b) to the operating elements.

Further, in the above embodiments, a plurality of stays (6, 6, and 6', or 60, 60', and 60") are provided, which serve to stably hold the first board (3, 30) in place.

The stays (6, 6, and 6', or 60, 60', and 60") have a U-shaped cross section. As a result, wiring of various cables in the case can be easily carried out by laying, through the stays, cables for connecting the first board (3, 30) and the second board (4, 40) and cables for connecting the second board and the third board (5, 50).

Furthermore, in the first embodiment, the connecting part (12) of the upper case 1 for connection to the stays 6, 6, and 6', the connecting part (61) of the stays 6, 6, and 6' for connection to the upper case 1, and the connecting part (31) of the first board 3 for connection to the above two connecting parts are fastened together by screws. This serves to reduce the number of parts and assembling steps required. The connecting part (71) of the operator base 7 can also be fastened by the same screws, which further reduces the number of parts and assembling steps required. Moreover, in the second embodiment, the connecting part (310) of the first board 30 for connection to the stays 60, 60', and 60", and the connecting part (710) of the above connecting part (310) and the operator base 70 are fastened together by screws. This serves to reduce the number of parts and assembling steps required.

Moreover, in the first embodiment, the bosses 7a of the operator base 7 with the operators provided thereon serve as the fastening part. The thickness (height) of the bosses 7a is used to set the gap between the first board 3 and the top plate 1A of the upper case 1. Therefore, a plurality of electronic apparatus of the same type or different types can be easily configured by providing a plurality of types of operator bases having different bosses of respective different values of thickness as the fastening part and fastening a desired one of the operator bases together with the upper case 1 (operating panel section) and the first board 3, or by providing a common operator base and a plurality of types of upper cases 1 having different mounts of respective different heights around the tightening threaded holes 11 and fastening the operator base together with one of the upper cases 1 and the first board 3, or by carrying out both of these methods. For example, by simply changing the operator base, the gap between the first board 3 and the top panel 1A can be adjusted between a plurality of electronic apparatuses of the same type or different types in which the switches or the like (operating elements) mounted on the first board are two-dimensionally arranged in the same manner but have different heights. Therefore, the same upper case and the lower case can be used between such electronic apparatuses. Furthermore, different types of electronic apparatus can also be dealt with by providing a desired one of spacers having respective different values of thickness between each boss 7a of the operator base 7 and the corresponding tightening threaded hole 11 in the upper case 1.

Moreover, in the second embodiment, the operator base 70 is disposed between the stays 60, 60' and 60", to which the first board 30 is attached, and the top panel 1A. A plurality of electronic apparatuses of the same type or different types can be easily configured by providing operator bases with different values of thickness and changing the height of the stays 60, 60', and 60" (the height of the legs 60A, 60A', and 60A").

Furthermore, in the second embodiment, for maintenance or repair, by removing the upper case 10 from the lower case 20, the disassembly or the like of the first board 30, second board 40, third board 50, and others can be easily accomplished in a normal state in which the lower case 20 is located downward.

The following measures can be taken for the contact part between the stays 6, 6, and 6' and the first board 3 in the first embodiment and the contact part between the stays 60, 60', and 60" and the first board 3 in the first embodiment. The stays and the first board are in contact with each other at the back surface of the first board. A land part (an exposed conductive part on which no insulating layer resist is coated) as an earthing or grounding terminal for the first board is formed at a part of the back surface of the first board which is in contact with at least one of the stays to use the stay as a conductive member. Then, since the land part is in contact with at least one stay, the first board may be grounded to the upper case 1 and the lower case 20 via the stay. Thus, grounding measures can be easily taken utilizing the at least one stay. Alternatively, the first board 1 may be grounded by providing separate wiring. In this case, the stays are made of an insulating material such as reinforced plastics, or an insulating material such as a tape is interposed between the stays and the first board. Further alternatively, the layout on the back surface of the first board may be designed such that the electric circuit formed on the first board does not lie over the surface part in contact with the stay.

In the above-described embodiments, the present invention is applied to mixers. However, it goes without saying that the present invention is applicable to various other kinds of electronic apparatuses.

What is claimed is:

1. An electronic apparatus comprising:
   a plurality of operators;
   a main case that covers said plurality of operators so as to allow the operators to be operated, said main case having opposite side plates;
   a first board mounted in said main case and having electronic circuitry formed thereon for processing signals generated by operations of the operators;
   a second board mounted in said main case and having electronic circuitry formed thereon for processing signals at least from said first board, said second board being disposed under said first board; and a plurality of stays that are arranged in parallel and spaced relation to each other, and connect between the opposite side plates of said main case, each of said stays being in a form of a bar having a U-shaped cross section;

wherein said stays are each placed on said first board along a substantially entire length thereof and are fastened to said first board and the side plates, and wherein said first board is disposed on said stays, and said second board is disposed under said stays.

2. An electronic apparatus according to claim 1, comprising an operator base mounted in said main case and disposed on said first board, said operator base having said plurality of operators provided thereon, said operator base having delimiting sections that delimit positions in which said operators are disposed.

3. An electronic apparatus according to claim 1, wherein said first board is connected to said second board via said stays.

4. An electronic apparatus according to claim 1, comprising a fastening device, and wherein said main case has a first connecting part for connection to said stays, said stays have a second connecting part for connection to said main case, and said first board has a third connecting part that is connected to said main case together with said first and second connecting parts, said first to third connecting parts being fastened together by said fastening device.

5. An electronic apparatus according to claim 4, wherein said operator base has a fourth connecting part for connection to said main case, said fourth connection part being fastened together with said first to third connecting parts by said fastening device.

6. An electronic apparatus according to claim 1, wherein each of said stays have a wiring accommodating section that accommodates wiring connecting between said first board and said second board.

7. An electronic apparatus according to claim 1, wherein said first board is interposed between the side plates of said main case and said stays and fastened together therewith.

8. An electronic apparatus comprising:

a plurality of operators;

a main case that covers peripheries of said plurality of operators so as to allow the operators to be operated, said main case having opposite side plates;

a first board mounted in said main case and having electronic circuitry formed thereon for processing signals generated by operations of the operators;

a second board mounted in said main case and having electronic circuitry formed thereon for processing signals at least from said first board, said second board being disposed under said first board;

a plurality of stays that are arranged in parallel and spaced relation to each other, and connect between the opposite side plates of said main case, each of said stays being in a form of a bar having a U-shaped cross section; and a third board mounted in said main case and disposed on said stay at a predetermined location thereof in a longitudinal direction thereof;

wherein said stays are each placed on said first board along a substantially entire length thereof and are fastened to said first board and the side plates, and wherein said first board is disposed on said stays, and said second board is disposed under said stays.

9. An electronic apparatus according to claim 8, wherein each of said stays have a wiring accommodating section that accommodates wiring connecting between said first board and said second board and wiring connecting between said second and said third board.

10. An electronic apparatus comprising:

an operating panel having a panel surface;

a plurality of operating elements disposed below said panel surface;

an operating circuit board having operating circuitry formed thereon for processing signals generated by operations of said operating elements, said operating circuit board having said operating elements provided thereon, said operating circuit board being disposed below said panel surface;

a plurality of operators disposed under said panel surface and connected to said operating elements; and an operator base having at least one boss, a main body and said operators provided thereon, said operators being connected to the main body using connecting means, said operator base being disposed under said panel surface, for delimiting positions in which said operators are disposed in mounting the operators into the electronic apparatus, said boss having a predetermined thickness that defines a distance from said panel surface to said operating circuit board;

wherein said operating circuit board is disposed under said panel surface via said operator base at the distance from said panel surface defined by the predetermined thickness of said boss.

11. An electronic apparatus according to claim 10, comprising a fastening device, and wherein said operator base has a first connecting part for connection to said panel surface, and said operating circuit board has a second connecting part for connection to said operator base, said first and second connecting parts being fastened together by said fastening device.

12. An electronic apparatus comprising:

an operating panel having a panel surface;

a plurality of operating elements disposed below said panel surface;

an operating circuit board having operating circuitry formed thereon for processing signals generated by operations of said operating elements, said operating circuit board having said operating elements provided thereon, said operating circuit board being disposed below said panel surface;

a plurality of operators disposed under said panel surface and connected to said operating elements;

an operator base having a main body and said operators provided thereon, said operators being connected to the main body using connecting means, said operator base being disposed under said panel surface, for delimiting positions in which said operators are disposed in mounting the operators into the electronic apparatus, said operator base having a predetermined thickness that defines a distance from said panel surface; and a plurality of stays to which said operating circuit board is attached, and that are arranged in parallel and spaced relation to each other, each of said stays being in a form of a bar having a U-shaped cross section;

wherein said operator base is disposed between said panel surface and said stays.

13. An electronic apparatus according to claim 12, further comprising at least one second board, and wherein said operating circuit board is connected to said second board via said stays.

14. An electronic apparatus comprising:
a plurality of operators;
a first board and having electronic circuitry formed thereon for processing signals generated by operations of said operators;
a second board and having electronic circuitry formed thereon for processing signals at least from said first board;
a plurality of stays that are arranged in parallel and spaced relation to each other, and expand in one direction along planes in which said first board and said second board are disposed, each of said stays being in a form of a bar having a U-shaped cross section, said first board being mounted on said stays and said second board being mounted under said stays;
an upper case that covers said plurality of operators;
a fixing device that fixes said stays to said upper case via said first board; and
a lower case that is disposed under said upper case to form a main case together with said upper case;
wherein said plurality of operators, said first board, said second board, and said stays fixed to said upper case via said first board by said fixing device are mounted in said main case between said upper case and said lower case.

15. An electronic apparatus according to claim 14, wherein each of said stays have a wiring accommodating section that accommodates wiring connecting between said first board and said second board.

16. An electronic apparatus being capable of connecting to an external apparatus, comprising:
a plurality of operators;
a first board having electronic circuitry formed thereon for processing signals generated by operations of said operators;
a second board having electronic circuitry formed thereon for processing signals at least from said first board;
a third board having electronic circuitry formed thereon for carrying out communication with the external apparatus;
an upper case that covers said plurality of operators;
a lower case that is disposed under said upper case to form a main case together with said upper case; and at least one stay that extends in one direction along planes in which said first board and said second board are disposed, said stay having downwardly extending legs at opposite ends thereof, said legs being mounted on said lower case;
wherein said plurality of operators, said first board, said second board, said third board, and said stay are mounted in said main case between said upper case and said lower case, and said first board, said second board, said third board are mounted on said stay.

17. An electronic apparatus according to claim 16, wherein said stay has a wiring accommodating section that accommodates wiring connecting between said first board and said second board and wiring connecting between said second and said third board.

18. An electronic apparatus comprising:
an operating panel having a panel surface;
a plurality of operating elements disposed below said panel surface;
an operating circuit board having operating circuitry formed thereon for processing signals generated by operations of said operating elements, said operating circuit board having said operating elements provided thereon, said operating circuit board being disposed below said panel surface;
a plurality of operators disposed under said panel surface and connected to said operating elements; and
an operator base having a main body and said operators provided thereon, said operators being connected to the main body using connecting means, said operator base being disposed under said panel surface, for delimiting positions in which said operators are disposed in mounting the operators into the electronic apparatus, said operator base having a predetermined thickness that defines a distance from said panel surface;
wherein said operator base has bosses having a predetermined thickness for attaching said operator base to said panel surface.

* * * * *